(12) United States Patent
Standing

(10) Patent No.: US 8,264,073 B2
(45) Date of Patent: Sep. 11, 2012

(54) MULTI-PHASE VOLTAGE REGULATION MODULE

(75) Inventor: Martin Standing, Kent (GB)

(73) Assignee: International Rectifier Corporation, El Segundo, CA (US)

( * ) Notice: Subject to any disclaimer, the term of this patent is extended or adjusted under 35 U.S.C. 154(b) by 451 days.

(21) Appl. No.: 12/044,333

(22) Filed: Mar. 7, 2008

(65) Prior Publication Data

US 2009/0108821 A1 Apr. 30, 2009

Related U.S. Application Data

(60) Provisional application No. 60/905,509, filed on Mar. 7, 2007.

(51) Int. Cl.
*H01L 23/02* (2006.01)
(52) U.S. Cl. .......................... 257/685; 257/686; 323/272
(58) Field of Classification Search .................. None
See application file for complete search history.

(56) References Cited

U.S. PATENT DOCUMENTS

| | | | | |
|---|---|---|---|---|
| 4,708,325 A | * | 11/1987 | Georges | 266/90 |
| 6,060,795 A | * | 5/2000 | Azotea et al. | 307/150 |
| 2001/0020909 A1 | * | 9/2001 | Sakuragi et al. | 341/139 |
| 2001/0030879 A1 | * | 10/2001 | Greenfeld et al. | 363/17 |
| 2001/0035746 A1 | * | 11/2001 | Burstein et al. | 323/283 |
| 2004/0119148 A1 | * | 6/2004 | Standing | 257/668 |
| 2004/0130913 A1 | * | 7/2004 | Giandalia et al. | 363/16 |
| 2004/0136208 A1 | * | 7/2004 | Agarwal et al. | 363/21.12 |
| 2007/0096274 A1 | * | 5/2007 | Pavier et al. | 257/676 |
| 2007/0164423 A1 | * | 7/2007 | Standing | 257/706 |

* cited by examiner

*Primary Examiner* — Evan Pert
*Assistant Examiner* — Fei Fei Yeung Lopez
(74) *Attorney, Agent, or Firm* — Farjami & Farjami LLP

(57) ABSTRACT

A voltage regulator module that includes components for a multi-phase converter, the converter including a plurality of power stage elements on one circuit board, a control element, driver elements, and elements for the output stages of the power stage elements on another circuit board.

20 Claims, 5 Drawing Sheets

MULTI-PHASE VOLTAGE REGULATION MODULE

PRIORITY CLAIM

This application is based on and claims priority to U.S. Provisional Patent Application Ser. No. 60/905,509, filed on Mar. 7, 2007 and entitled MULTIPHASE VOLTAGE REGULATION MODULE, the entire contents of which is hereby incorporated by reference.

FIELD OF THE INVENTION

This invention relates to semiconductor device packages and more specifically relates to a single module for a multi-phase synchronous buck voltage regular module (VRM).

BACKGROUND AND SUMMARY OF THE INVENTION

The packaging of small sections of a portion of a circuit such as the power die for half bridges, full bridges and synchronous buck circuits employing insulated metal substrates (IMS), direct bonded copper (DBC) and insulation boards with metal tracks (FR4) are known. According to the prior art, these individual packages are then assembled on a common substrate to form a complete circuit.

In accordance with the invention, the components for the power stage of a converter circuit, such as the power switches of a multi-phase buck converter, are mounted on one circuit board such as an IMS substrate and are captured between the surface of the IMS substrate and another circuit board such as an FR4 board which carries the driver ICs for the power devices, the output capacitors, the output inductors and the controller for the converter.

DETAILED DESCRIPTION OF THE INVENTION

Figure 1:
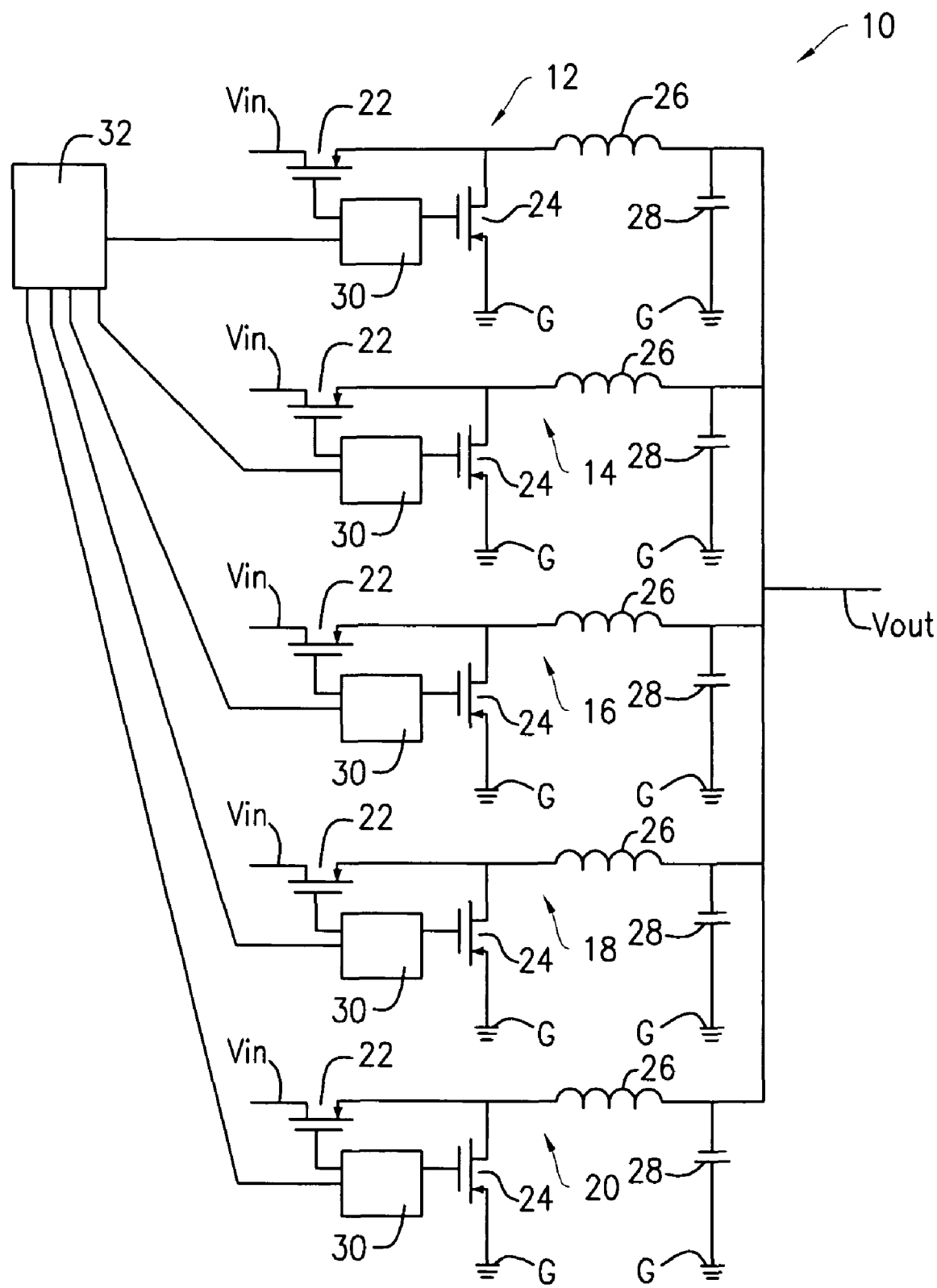
FIG. 1 is a circuit diagram of a multi-phase buck converter circuit.
Figure 2A:
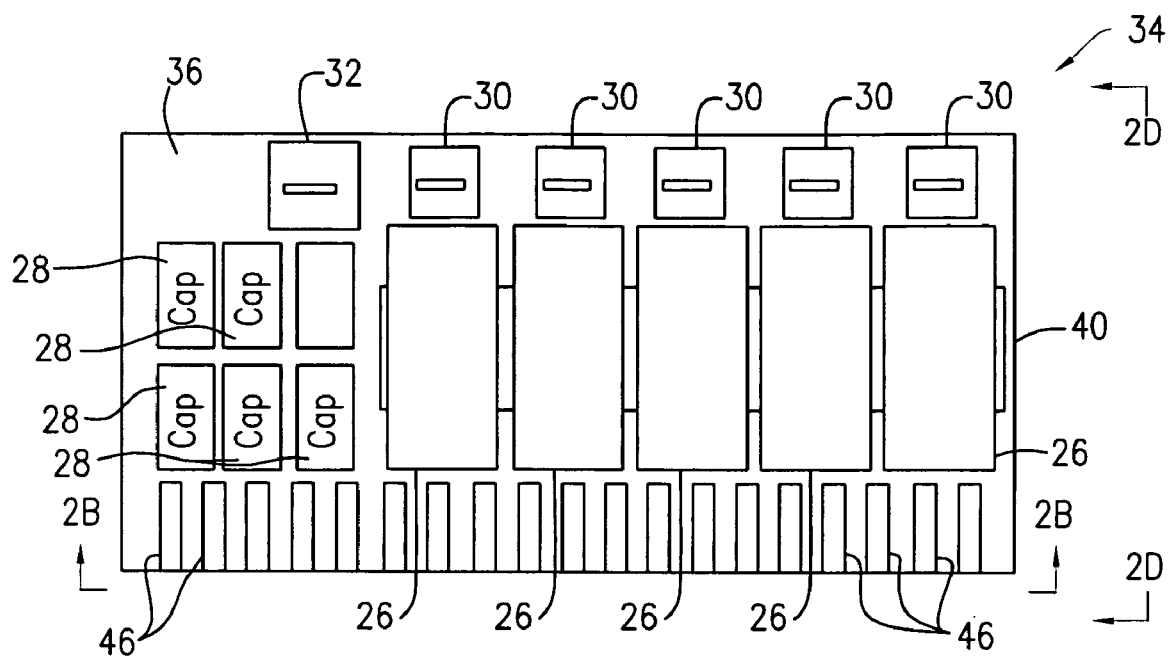
FIG. 2A illustrates a top plan view of a module according to the present invention.
Figure 2B:
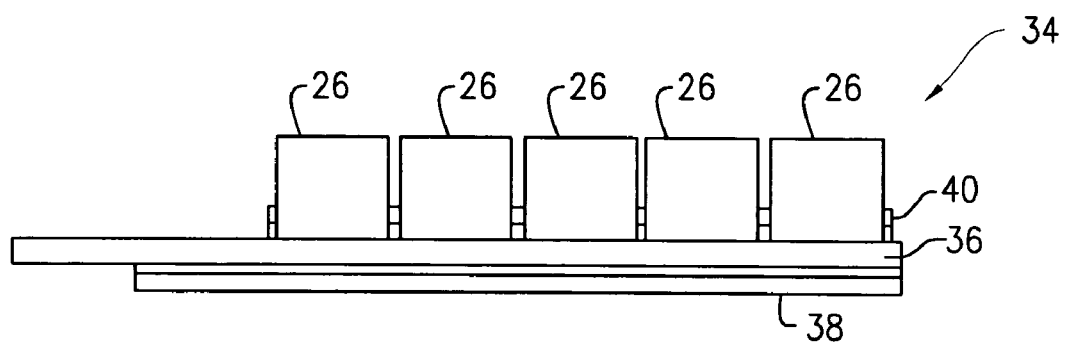
FIG. 2B illustrates a side view (viewed in the direction of arrows 2B-2B) of a module according to the present invention.
Figure 2C:
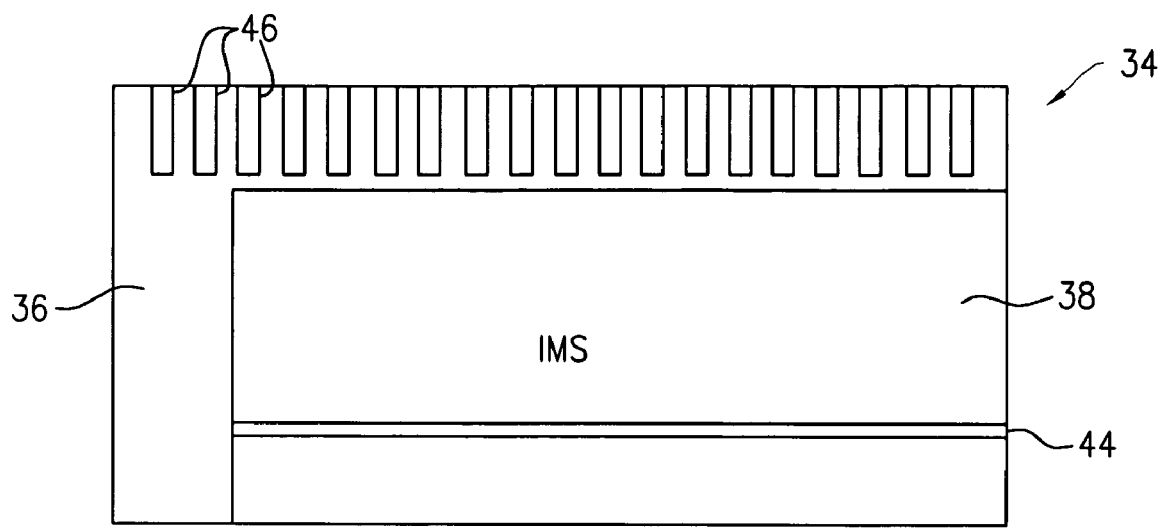
FIG. 2C illustrates a bottom view of a module according to the present invention.
Figure 2D:
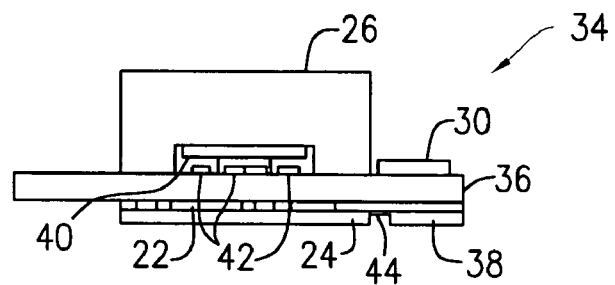
FIG. 2D illustrates another side view (viewed in the direction of arrows 2D-2D) of a module according to the present invention.

FIG. 1 schematically illustrates a multi-phase buck converter 10 that includes five buck converter circuits 12, 14, 16, 18, 20 parallel connected between a voltage input Vin and ground G and to supply a DC current to a common output Vout. Each buck converter circuit includes a power stage, an output stage, and a driver stage. Each power stage includes a control switch 22 series connected with a synchronous switch 24 in a half-bridge configuration as is well known. For example, control switch 22 and synchronous switch 24 may be N-channel MOSFETs. The output of each power stage is coupled to the input of an output stage which includes an inductor 26 series connected with an output capacitor 28. Output capacitor 28 is coupled between ground G and the output of the multi-phase converter Vout, while inductor 26 is coupled between the output of the multi-phase buck converter Vout and the output of the power stage. Each buck converter circuit further includes a driver stage which is a driver circuit 30 coupled to the gates of switches 22, 24 to drive the same, as is well known. Multi-phase buck converter 10 further includes a controller 32 which controls the operation of driver 30 of each buck converter circuit 12, 14, 16, 18, 20.

Referring now to FIGS. 2A-2D, a module according to an embodiment of the present invention includes all elements needed for a multi-phase buck converter. Specifically, a module 34 according to the present invention includes a first circuit board 36, which preferably is an FR4 type circuit board, and a second circuit board 38, which is preferably an insulated metal substrate (IMS), direct-bonded copper (DBC) substrate or the like. First circuit board 36 includes a first surface on which drivers 30, output capacitors 28, and inductors 26 for each buck converter circuit 12, 14, 16, 18, 20 are disposed. Furthermore, controller 32 is disposed on the first surface of first circuit board 36. Power switches 22, 24 for each buck converter circuit 12, 14, 16, 18, 20 are disposed on one surface of second circuit board 38, and disposed between a second surface (opposite to the first surface) of first circuit board 36 and the one surface of the second circuit board 38.

According to an aspect of the present invention, a heat spreader 40, which may be a bar of cooper or copper based alloy, is thermally coupled to inductors 26. Specifically, inductors 28 may be C-shaped bodies which straddle second circuit board 38 and heat spreader 40 is coupled to an interior surface of each C-shaped inductor 26 facing the first surface of first circuit board 36. Note that other passive components 42 (e.g., capacitors, etc.) may be mounted on the first surface of first circuit board 36 and optionally thermally coupled to heat spreader 40.

According to another aspect of the present invention, second circuit board 38 is scored, i.e., includes a score 44 or trench, whereby the transfer of heat to areas under drivers 30 on first circuit board 36 is slowed.

Although not specifically shown in the figures, one skilled in the art should recognize that to realize a circuit such as the one shown by FIG. 1, first circuit board 36 and second circuit board 38 include appropriate conductive pads, conductive traces, and conductive vias to attain the electrical connection between the various components to obtain a multi-phase buck converter as illustrated by FIG. 1.

It should be noted, that in the preferred embodiment, first circuit board 36 includes a plurality of edge connectors 46 disposed along one edge thereof. Edge connectors 46 serve as input/output terminals to receive (e.g., Vin) or send power (e.g., Vout), for ground G connection, or to receive or send any other external signal necessary for the operation of the module.

Figure 3:
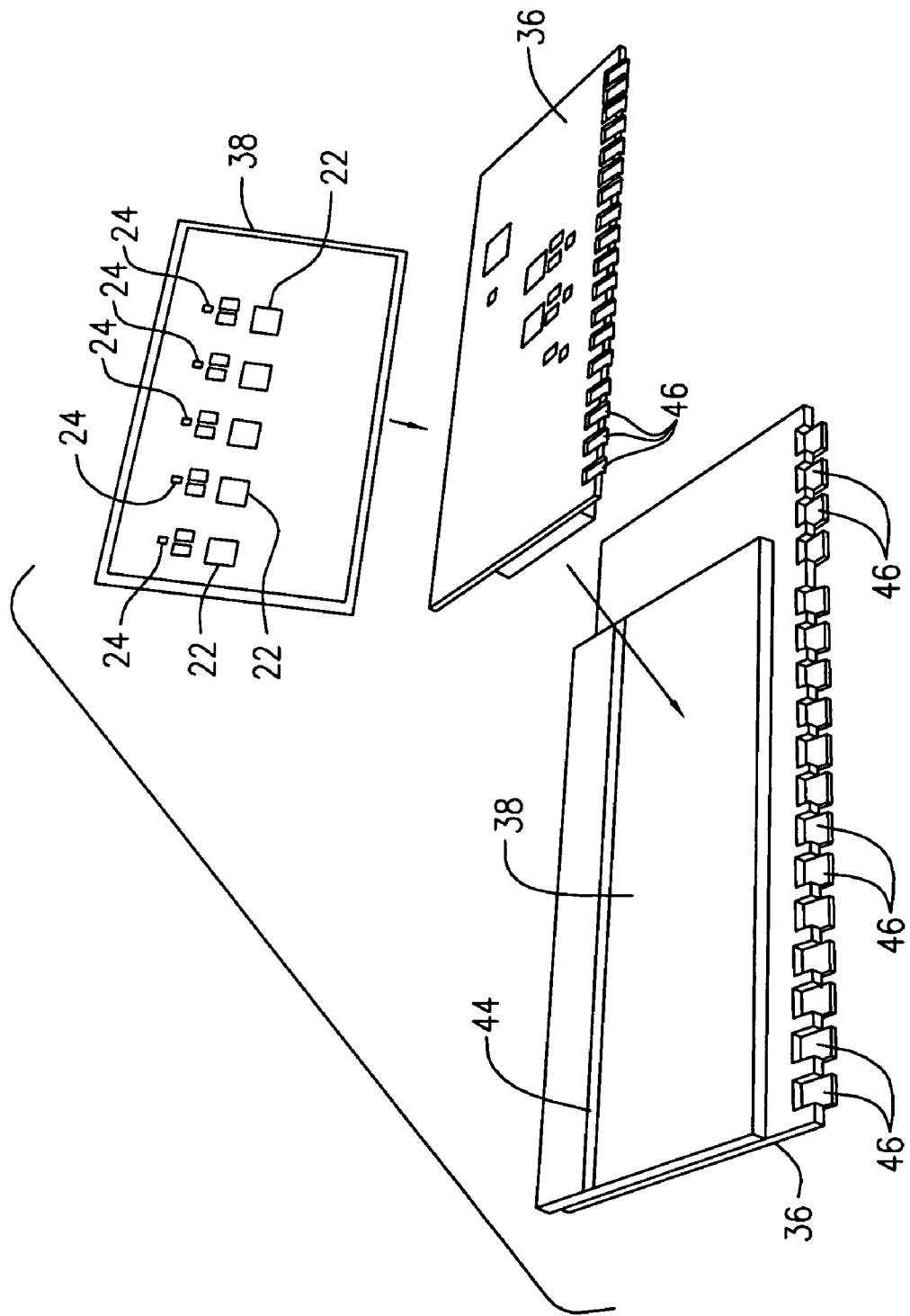
FIG. 3 illustrates selected steps in the assembly of a power module according to the present invention.

Referring now to FIG. 3, to fabricate a module according to the present invention, respective electrodes of switches 22, 24 are first electrically and mechanically coupled (using, for example, solder, conductive epoxy or the like) to respective conductive pads (not shown) on second circuit board 38. Thus, for example, the source electrode and the gate electrode of each switch 22 are coupled to respective source and gate pads, while the drain electrode of each switch 24 is coupled to a respective drain pad. Thereafter, second circuit board 38 is mounted onto the second surface of the first circuit board 36. Note that the second surface of the first circuit board 36 includes source pads and gate pads for electrical and mechanical connection (using solder or other conductive adhesive) to source and gate electrodes of switches 24 and drain pads for electrical and mechanical connection (using solder or other conductive adhesive) to the drain electrodes of switches 22.

Figure 4:
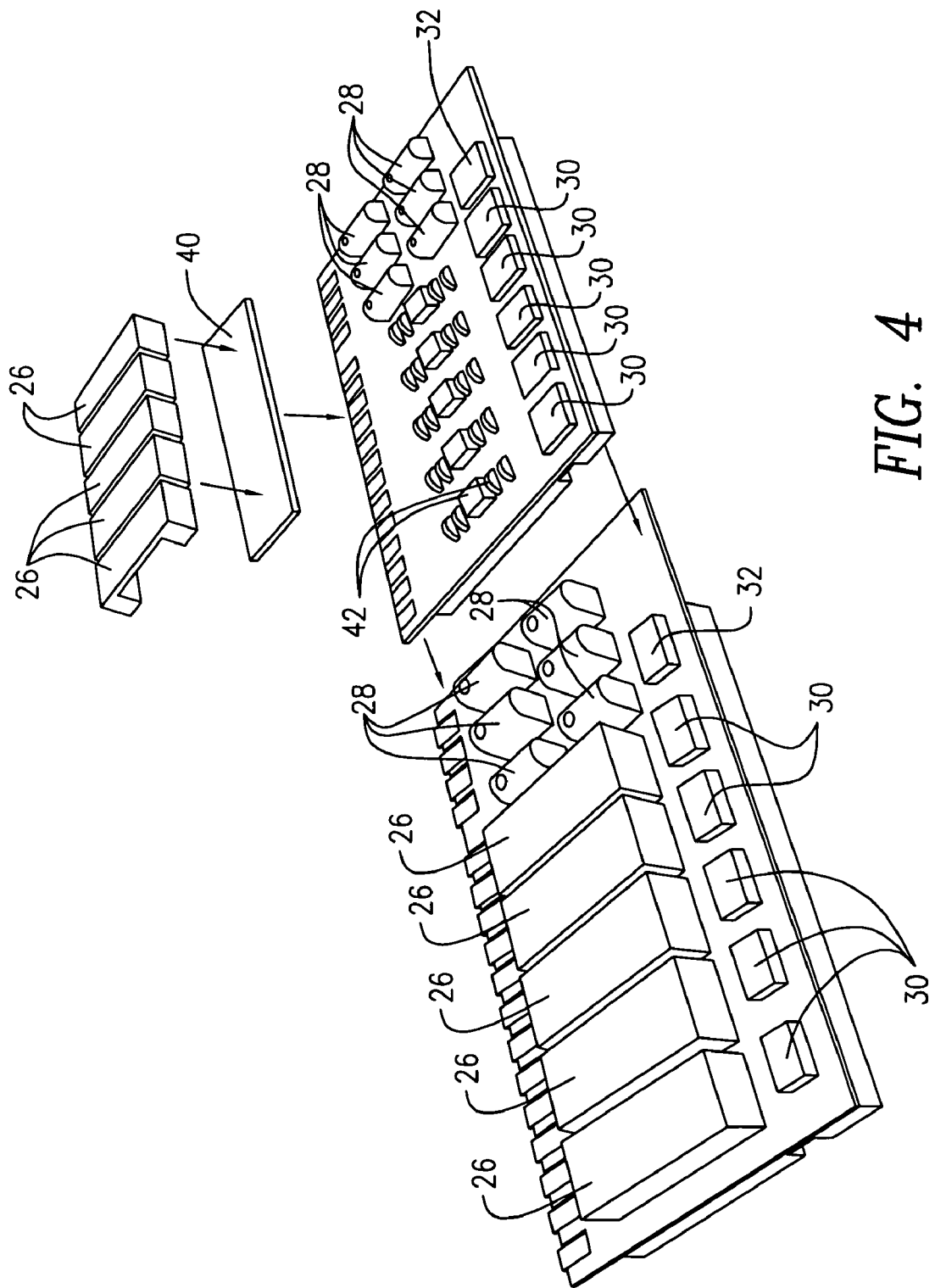
FIG. 4 illustrates further steps in the assembly of a module according to the present invention.

FIG. 4 illustrates that after (or before) the assembly of second circuit board 38, heat spreader 40 is assembled over components 42 followed by the assembly of inductors 26 to obtain a module according to the present invention.

Note that, although the preferred embodiment includes five converter circuits, a VRM module according to the present invention may include fewer or more converter circuits (e.g., buck converter circuits) without deviating from the scope and spirit of the present invention.

A module configuration according to the present invention offers the ability to significantly shrink the size of conventional designs that use conventional packaging techniques. For instance, packaging the die in multiples is more space efficient than mounting discrete packaged devices. Moreover, stacking the components results in size reduction.

In addition, while reducing the size would normally lead to a reduction in thermal performance, the use of a circuit board such as an IMS may result in more efficient thermal transfer to alleviate the reduction in thermal performance due to size reduction.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power module, comprising: a first circuit board; a second circuit board comprising a first surface and a second surface that is opposite said first surface and that is scored to slow heat transfer; and a multi-phase converter circuit that includes a controller and a plurality of converter circuits, each converter circuit including a power stage, an output stage, a driver stage; wherein said power stages reside on said first surface of said second circuit board, said power stages residing between said first and second circuit boards; and wherein said controller, said output stages and said drivers reside on said first circuit board.

2. The power module of claim 1, wherein said first circuit board is an FR4 type circuit board and said second circuit board is an IMS.

3. The power module of claim 1, wherein said converter circuits are buck converters.

4. The power module of claim 1, wherein each said output stage includes an inductor and an output capacitor.

5. The power module of claim 4, wherein each inductor is C-shaped.

6. The power module of claim 4, further comprising a heat spreader thermally coupled to said inductors.

7. The power module of claim 1, wherein said first circuit board includes a plurality of edge connectors serving as input/output terminals for said converter.

8. The power module of claim 1, wherein each power stage includes a control switch and synchronous switch in half-bridge arrangement.

9. The power module of claim 8, wherein said switches are MOSFETS.

10. The power module of claim 8, wherein said control switches and said synchronous switches are captured between said first and said second circuit boards.

11. A power module, comprising: a first circuit board comprising a first surface and a second surface opposite said first surface; a heat spreader disposed on said first surface of said first circuit board; a second circuit board comprising a first surface and a second surface that is opposite said first surface and that is scored to slow heat transfer; and a multi-phase converter circuit comprising a controller and a plurality of converter circuits, each of said plurality of converter circuits comprising a power stage, an output stage, and a driver stage; wherein said power stages reside on said first surface of said second circuit board, said power stages residing between said first and second circuit boards; wherein said controller, said output stages, and said drivers reside on said first surface of said first circuit board; and wherein each of said output stages comprise an inductor that faces said first surface of said first circuit board, said heat spreader coupled to an interior surface of each inductor.

12. The power module of claim 11, wherein said first circuit board comprises an FR4 type circuit board and said second board comprises an IMS.

13. The power module of claim 11, wherein said plurality of converter circuits comprise buck converters.

14. The power module of claim 11, wherein each said output stage further comprises an output capacitor.

15. The power module of claim 11, further comprising at least one passive component disposed on said first surface of said first circuit board.

16. The power module of claim 14, wherein said at least one passive component is coupled to said heat spreader.

17. The power module of claim 11, wherein said first circuit board includes a plurality of edge connectors serving as input/output terminals for said multi-phase converter circuit.

18. The power module of claim 11, wherein each power stage includes a control switch and a synchronous switch in a half-bridge arrangement.

19. The power module of claim 18, wherein said switches are MOSFETS.

20. The power module of claim 18, wherein said control switches and said synchronous switches are captured between said first and said second circuit boards.

* * * * *